United States Patent [19]

Asakawa

[11] Patent Number: 4,535,278

[45] Date of Patent: Aug. 13, 1985

[54] TWO-DIMENSIONAL PRECISE POSITIONING DEVICE FOR USE IN A SEMICONDUCTOR MANUFACTURING APPARATUS

[75] Inventor: Teruo Asakawa, Nirasaki, Japan

[73] Assignee: Telmec Co., Ltd., Nirasaki, Japan

[21] Appl. No.: 481,324

[22] Filed: Apr. 1, 1983

[30] Foreign Application Priority Data

Apr. 5, 1982 [JP] Japan .................. 57-56344

[51] Int. Cl.³ .............................. G05B 11/00
[52] U.S. Cl. ..................... 318/687; 318/135
[58] Field of Search .......... 310/49 R, 13, 12; 318/135, 687, 682

[56] References Cited

U.S. PATENT DOCUMENTS

| | | | |
|---|---|---|---|
| 3,376,578 | 4/1968 | Sawyer | 346/29 |
| 3,851,196 | 11/1974 | Hinds | 310/12 |
| 3,878,411 | 4/1975 | Nocito et al. | 310/12 |
| 3,881,139 | 4/1975 | Inaba et al. | 318/38 |
| 3,935,486 | 1/1976 | Nagashima | 310/12 |
| 4,075,518 | 2/1978 | Koehler et al. | 310/49 R |
| 4,187,453 | 2/1980 | Rough | 318/135 |
| 4,455,512 | 6/1984 | Cornwell et al. | 318/135 |

OTHER PUBLICATIONS

Proceedings of the 4th Intersociety Energy Conversion Engineering Conference, Washington, D.C., USA, Sep. 22–26, 1969.
Conference: Proceedings of Southeastern, Roanoke, VA, USA, Apr. 1–4, 1979.

*Primary Examiner*—William M. Shoop, Jr.
*Assistant Examiner*—Saul M. Bergmann
*Attorney, Agent, or Firm*—Price, Heneveld Huizenga & Cooper

[57] ABSTRACT

A precision positioning device particularly adapted for use in a semiconductor manufacturing operation is provided which comprises a loading table, an armature and a two-dimensional current-motion converter having a magnetic field group and a first coil group. The magnetic field group is formed from a plurality of magnetic fields disposed on a plane in a two-dimensional array. The centers of the magnetic fields of the array are separated by an equal period. The magnetic fields of the array are disposed perpendicular to the plane and adjacent magnetic fields are directed in alternate directions. The first coil group comprises at least first, second, third and fourth coils having a fixed dimensional relationship. More particularly, each coil is provided with an outer dimension approximately equal to three halves of the magnetic fields and a coil width approximately equal to one-half of the period of the array. The four coils are separated along the plane by separation distances which equal an odd multiple of approximately one-half of the period of the array of magnetic fields.

18 Claims, 11 Drawing Figures

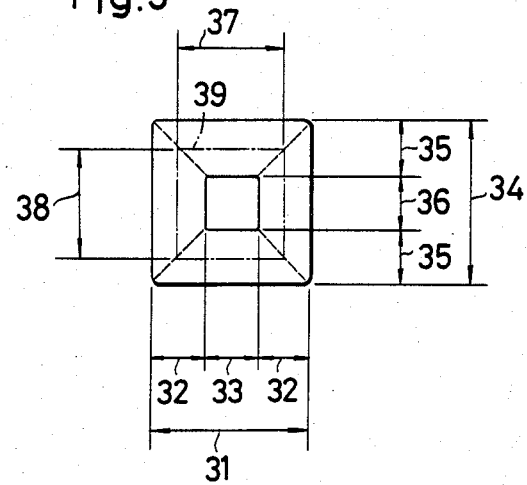
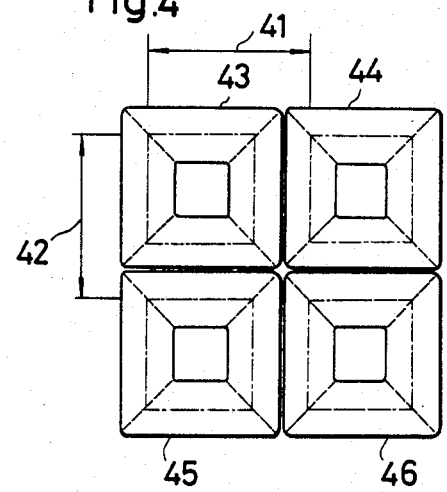

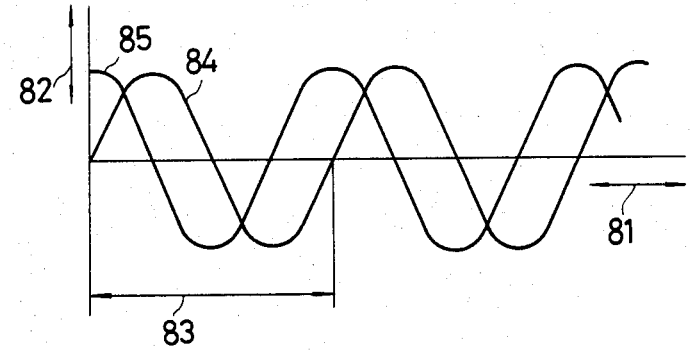
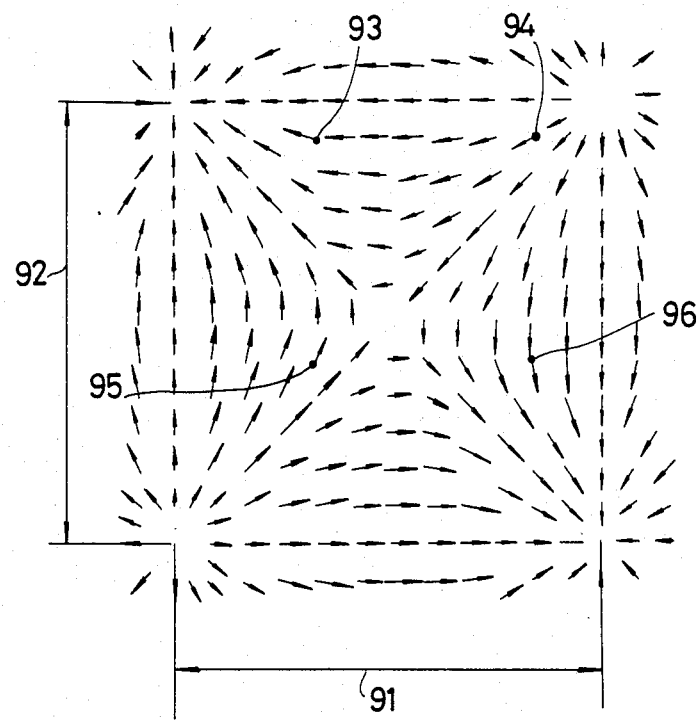

TWO-DIMENSIONAL PRECISE POSITIONING DEVICE FOR USE IN A SEMICONDUCTOR MANUFACTURING APPARATUS

BACKGROUND OF THE INVENTION

The present invention relates to a novel driving device consisting of a stator and an armature in which the armature is moved along a plane by an electric current, and a two-dimensional precise positioning device making use of the driving device for use in a semiconductor manufacturing apparatus.

In the past, it has been common to use a precise positioning device in a semiconductor manufacturing apparatus which comprises a finely displacable loading table. Prior art methods for driving the loading table involve the use of a step motor or a rotary type D.C. servo motor the rotational motion being converted into a linear motion by means of a feed screw or the like. However, in view of the mechanical structure of these devices it is difficult to give a microfine movement of 1 micron or less to a loading table, and if it is intended to obtain a high resolution, generally the moving speed is slow due to the fact that the pitch of the screw becomes fine. Consequently, in most examples the loading table was formed with a double structure in which a microfine displacement was separately provided, and so the device was mechanically complex and expensive. On the other hand, recent development of D.C. linear motors has advanced and excellent results have been obtained achieving high resolution of 1 micron or less and high speed movement. However, both the method depending upon feeding of a screw and the method employing a linear motor can provide only a linear motion to the loading table. In general there are many cases where the loading table must achieve a two-dimensional motion along a plane. Thus, it has been common practice to construct an X-Y orthogonal coordinate system by making use of linear driving sources which are orthogonal to each other and providing guide rails for restraining movements in the directions other than the driving directions.

SUMMARY OF THE INVENTION

It is one object of the present invention to provide a novel two-dimensional current-motion converter serving as a driving device that is movable in two-dimensional directions.

Another object of the present invention is to provide a two-dimensional positioning device which can achieve positioning in two-dimensional directions precisely and at a high speed without employing a double structure or guide rails by making use of the aforementioned two-dimensional current-motion converter.

According to one feature of the present invention, a two-dimensional current-motion converter is provided comprising a two-dimensional array of magnetic fields disposed perpendicular to a plane and having alternately arranged field orientations. Each magnetic field of the array is positioned at equal intervals or periods along said plane to form a magnetic field group. At least four coils are being integrally fixed to each other either directly or indirectly to form a coil group, and said coil group is disposed within said array of magnetic fields so as to be freely movable along said plane. The four coils are provided with a fixed dimensional relationship, each coil being provided with an outer dimension approximately equal to 3/2 of the period of the array and a winding width of approximately ½ the period of the array. The coils are provided spaced from one another along the plane of the array by odd number multiples of approximately ¼ the period of the array.

BRIEF DESCRIPTION OF THE DRAWINGS

The above-mentioned and other features and objects of the present invention will become more apparent by reference to the following description of preferred embodiments of the invention taken in conjunction with the accompanying drawings, wherein:

FIG. 3 is a plan view of a coil to be used in the two-dimensional current-motion converter in FIGS. 1 and 2;

FIG. 4 is a plan view of a coil group formed by fixing four coils as shown in FIG. 3 to each other;

FIG. 8 shows two curves of a force exerted in one dimensional direction versus a position of two coils in the coil group in the two-dimensional current-motion converter according to the present invention;

FIG. 9 is a schematic view showing forces exerted upon one coil as energized in the same coil group at various points within the magnetic field group formed by the stator when the coil is moved through the magnetic field group;

DESCRIPTION OF THE PREFERRED EMBODIMENTS

Figure 11:
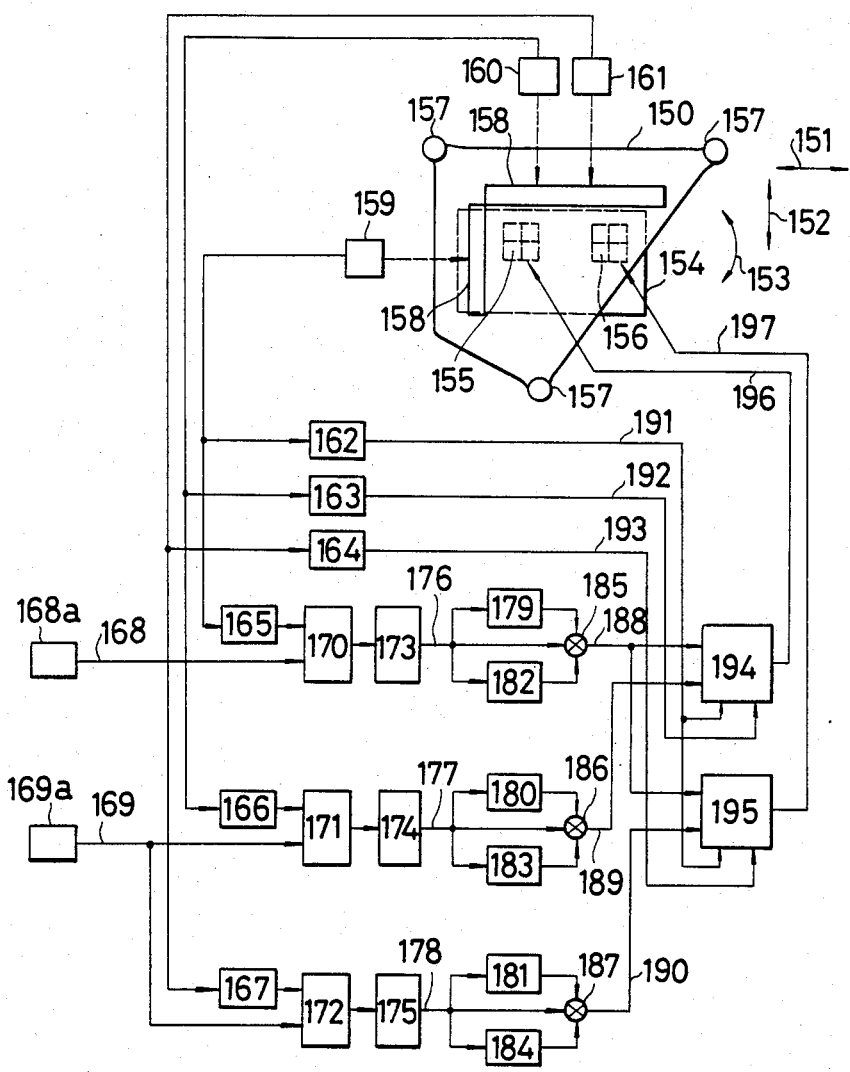
FIG. 11 is a block diagram showing the entire construction of the same two-dimensional precise positioning device.

In order to facilitate understanding of the present invention, description will start from explanation of the entire construction of the two-dimensional precise positioning device according to the present invention illustrated in FIG. 11.

In FIG. 11, reference numeral 150 designates a loading table which is, in the illustrated example, movable only in the directions indicated by arrows 151,152 and 153. In the following, with respect to FIG. 11, the direction of the arrow 151 is called "X-direction", the direction of the arrow 152 is called "Y-direction" and the direction of the arrow 153 is called "θ-direction". The loading table 150 can be moved in the X-, Y- and θ-directions with an extremely small force, for example, by disposing flat plate type static pressure pneumatic bearings as shown at 157.

Reference numerals 154, 155 and 156 are components of a two-dimensional current-motion converter according to the present invention, numeral 154 designates a stator forming a magnetic field, and numerals 155 and 156, respectively, designate coil groups serving as armatures. The two armatures 155 and 156 are mounted on the bottom of the loading table separated in the X-direction, they use the magnetic field of the stator 154 in common, and their plane of movement is in parallel to the plane of movement of the loading table.

The respective coil groups have a capability of simultaneously generating a force in the X-direction and a force in the Y-direcion, and by using the two coil groups together it is possible to obtain a torque in the $\theta$-direction. While the two coil groups are kept apart in the X-direction in the illustrated example, they could be kept apart in any arbitrary direction within the X-Y plane, and while the magnetic field serves as a stator and the coil group serves as an armature in the illustrated example, it is possible to reverse this relation. In addition, in order that the area of the magnetic field forming member is reduced and yet a wide motion area can be obtained, it is also possible that a number of additional coil groups would be added and these coil groups would be switched depending upon the position of the armature.

Reference numerals 158, 159, 160 and 161 designate component elements of a position detector for knowing a present position of the loading table 150. While the plane mirrors and the laser ranging devices well-known in the prior art are used in the illustrated example, any kind of position detector could be used so long as it can detect displacements in the X-, Y- and $\theta$-directions of the loading table 150. Reference numeral 158 designates plane mirrors having a high precision, and reference numerals 159, 160 and 161 designate detectors for the respective axes in the laser ranging device. A displacement in the X-direction is obtained by the laser ranging device 159, displacements in the Y-direction at two positions on the loading table are obtained by the laser ranging devices 160 and 161, respectively, and a displacement in the $\theta$-direction is obtained from a difference between detected values of the laser ranging devices 160 and 161. The laser ranging device used in this example achieves a high resolution of 0.079 microns or less by employing a plane mirror.

Reference numerals 162, 163 and 164 designate a first group of counters for holding positional relationships between the magnetic field and the coil groups with respect to the position in the X-direction of the loading table and with respect to the two positions in the Y-direction of the loading table, and these counters are always renewed by the outputs from the position detectors 159, 160 and 161.

Reference numerals 165, 166 and 167 designate a second group of counters for always holding the present position of the loading table according to the signals sent from the position detectors 159, 160 and 161. The counter 165 indicates the present position in the X-direction of the loading table, and the counters 166 and 167 indicate the present positions in the Y-direction of two points on the loading table. The outputs of the second group of counters are respectively applied to digital subtractors 170, 171 and 172. On the other hand, reference numerals 168a and 169a designate digital signal devices which issue digital signals representing desired stop positions in the X-direction and in the Y-direction, respectively. A signal 168 issued from the device 168a is applied to the digital subtractor 170, and a signal 169 issued from the device 169a is applied to the digital subtractors 171 and 172. Accordingly, the output of the digital subtractor 170 represents a difference between the desired stop position in the X-direction and the present position, that is, it becomes a position error digital signal, and likewise the outputs of the digital subtractors 171 and 172 become position error digital signals in the Y-direction of two different points on the loading table.

The outputs of the subtractors 170, 171 and 172 are converted into analog signals 176, 177 and 178 by means of digital-analog converters shown at 173, 174 and 175, respectively. Accordingly, the signal 176 is an X-direction position error analog signal, and the signals 177 and 178 are Y-direction position error analog signals at two different points on the loading table. The signals 176, 177 and 178 are applied to adders 185, 186 and 187, respectively, also they are differentiated by differentiators 179, 180 and 181, respectively, to produce the respective velocity signals and then applied to the adders 185, 186 and 187, respectively, with their algebraic sign reversed, and further for the purpose of improvements in response to minute displacements they are integrated by integrators 182, 183 and 184 and then also applied to the adders 185, 186 and 187, respectively, to produce drive demand signals 188, 189 and 190, respectively.

Reference numerals 194 and 195 designate driving force distribution control circuits forming a two-dimensional driving device according to the present invention as will be explained later, which are the circuits for obtaining driving forces proportional to the magnitude and polarity of the drive demand signals by distributing the drive demand signals in the X- and Y-directions over the integrally formed four coils as currents according to the positional relationship between the coils and the magnetic field. To the control circuit 194 are input the signal 188 as an X-direction drive demand signal, the signal 189 as a Y-direction drive demand signal, further a signal 191 as a positional relation signal between the magnetic field and the coils in the X-direction and a signal 192 as a positional relation signal between the magnetic fields and the coils in the Y-direction, and a signal group 196 for controlling the coil group 155 is output from the control circuit 194. Likewise to the control circuit 195 are input the aforementioned signals 188 and 190 as X-direction and Y-direction drive demand signals, respectively, and the aforementioned signals 191 and 193 as positional relation signals between the magnets and the coils in the X- and Y-directions, respectively, and a signal group 197 for controlling the coil group 156 is output from the control circuit 195. Accordingly, the coil groups 155 and 156 generate forces proportional to the X- and Y-direction drive demand signals 188 and 189 and the X- and Y-direction drive demand signals 188 and 190, respectively and thereby the position and attitude of the loading table can be corrected.

If this system including the first counter group 162, 163 and 164, the drive distribution control circuits 194 and 195, the stator 154 and the armatures 155 and 156 is deemed jointly as a D.C. motor having driving forces in the X-, Y- and $\theta$-directions, then this is equivalent to the heretofore known D.C. servo system. Accordingly, the loading table 150 moves towards the position of the X-Y coordinate given by the signals 168 and 169, and it stops at the position where given coordinates become equal to the coordinate obtained from the above-described position detector. Furthermore, since feedback is provided such that the coordinates obtained from the Y- direction position detectors, placed at two points having different X-coordinates, may be held equal to the signal 169, the loading table 150 does not require a guide rail, and yet rotation of the loading table will not occur.

Thus, to the present invention, the basically well-known D.C. servo system, which was a driving device consisting of a rotary type D.C. motor or a linear D.C. motor in the prior art, is replaced by a special novel two-dimensional current-motion converter as indicated by reference numerals 154, 155 and 156, and jointly with a first counter group 162, 163 and 164 forming a control circuit and a drive distribution control circuit 194 and 195 constructs a special two-dimensional driving device. In the following, description will be made on this two-dimensional driving device, that is, a two-dimensional current-motion converter and a drive circuit therefor in combination.

The two-dimensional current-force converter according to the present invention makes use of a force generated when an electric current is passed through a coil placed in a magnetic field, and as a matter of course, though either the magnetic field side or the coil side could be used as a stator. However, in the following description, for convenience the magnetic field side is handled as a stator and the coil side is handled as an armature.

Figure 1:
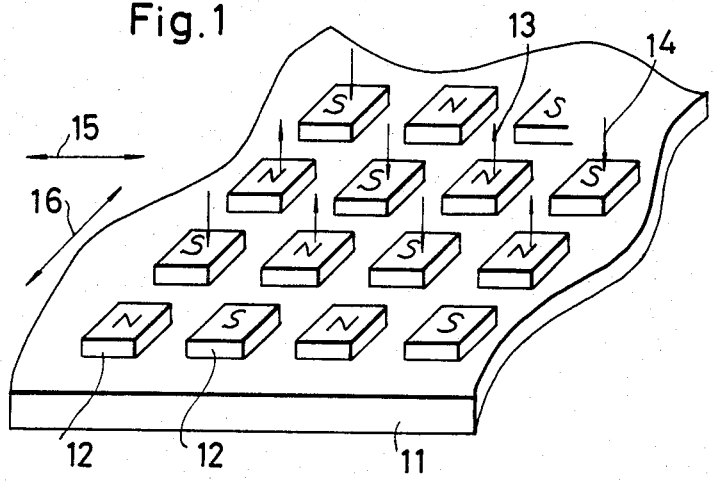
FIG. 1 is a perspective view of a section forming a magnetic field group in a two-dimensional current-motion converter according to the present invention.

At first, one example of a magnetic field is shown in FIG. 1. In FIG. 1, reference numeral 11 designates a member forming a part of a magnetic path and holding permanent magnets, numeral 12 designates permanent magnets which are magnetized in the direction of magnetic axes represented by arrows 13 and 14, and they are arrayed in the direction of arrows 15 and 16 at equal intervals with their N and S poles aligned alternately. Accordingly, the directions 13 and 14 of the magnetic fields are arrayed alternately.

Figure 2:
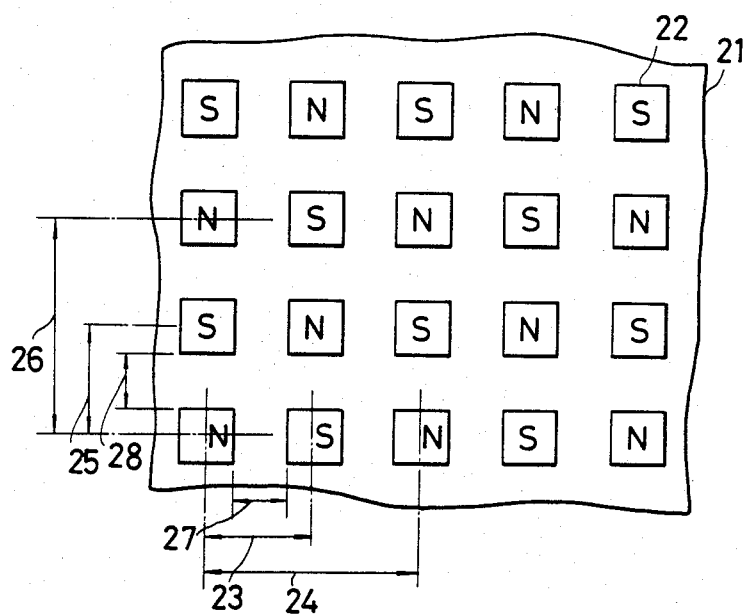
FIG. 2 is a plan view of the same section.

FIG. 2 is a plan view of the magnet array in FIG. 1, reference numeral 21 corresponds to numeral 11 in FIG. 1 and reference numeral 22 corresponds to numeral 12 in FIG. 1. Reference numerals 24 and 26 designate periods of magnetic fields in the two orthogonal directions, and reference numerals 23 and 25 designate periods of arrays of the permanent magnets. In the illustrated example, permanent magnets are disposed on a plate of soft iron. However, so long as the illustrated magnetic fields can be obtained, as a matter of course, the material and structure of the magnetic field forming means is of no matter. In other words, the permanent magnet could be replaced by electromagnets and every such modification is included within the scope of the present invention.

One example of a coil is illustrated in FIG. 3, and one example of an array of coils in one coil group is illustrated in FIG. 4. Reference numerals 31 and 34 designate an outer dimension of the coil, and in the illustrated example, it is nearly equal ⅔ of the periods 23 and 25, respectively, of the magnetic fields. Reference numerals 32 and 35 designate winding widths of the coil, and in the illustrated example it is equal to nearly ½ of the periods 23 and 25, respectively, of the periods of the magnetic field. Accordingly at the center of the coil is provided a hole having dimensions 33 and 36, respectively, that is nearly ½ of the periods 23 and 25, respectively, of the magnetic fields. Reference numeral 39 designates a center line of the coil, and edges 37 and 38 of the square of the center line have nearly equal dimensions to the periods 23 and 25 of the magnetic fields. According to the method of controlling this two dimensional current-motion converter as will be described later, preferably the coil should have a square or rectangular shape as shown in FIG. 3. However, the present invention can be practiced even in the case where the coil is circular or nearly circular.

Now description will be made of an array of coils comprising a coil group. Each coil group of the two-dimensional current-motion converter of the present invention requires at least four coils, and these coils in combination generate a driving force. While it is possible to use more than four coils and to use these coils either simultaneously or switched from one to another, this in principle is no different from the case of using four coils, and the following description will be made with respect to an example employing four coils.

Reference numerals 43, 44, 45 and 46 each represent the coil shown in FIG. 3. In this example, the coil 44 is displaced from the coil 43 in the direction of an arrow 41 by nearly ⅔ of the period of the magnetic field in this direction. The coil 45 is displaced from the coil 43 in the direction of an arrow 42 by nearly ⅔ of the period of the magnetic field in this direction, and the coil 46 is placed it is displaced in the directions of arrows 41 and 42 by nearly ⅔ of the period of the magnetic field in these directions. While the coils have all been displaced by ⅔ of the period of the array of the magnetic field in the illustrated example, in principle, the dimension of displacement could be any odd number multiple of ½ of the period of the magnetic field.

Figure 5:
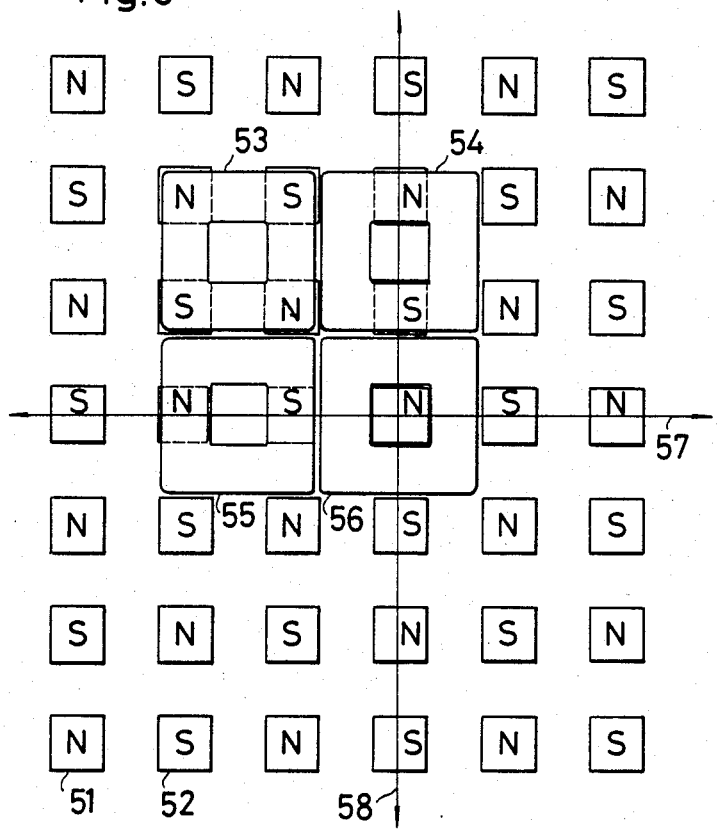
FIG. 5 is a schematic view showing a positional relationship along a plane of movement between the magnetic field group and the coil group in the two-dimensional current-motion converter according to the present invention.

FIG. 5 is a plan view of the relation between the magnetic field distribution shown in FIG. 2 and the coil group shown in FIG. 4. In the state shown in FIG. 5, even if an electric current is passed through the coil 53, forces exerted upon the coil by the magnetic field directed in the same direction placed on a diagonal would offset each other, and so no force is generated. On the other hand, if an electric current is passed through the coil 54, then a driving force depending upon the direction of the electric current is generated along an axis represented by arrows 58. Likewise, if an electric current is passed through the coil 55, then a driving force depending upon the direction of the electric current is generated along an axis represented by arrows 57. The coil 56 is placed outside of the magnetic field, and hence, even if an electric current is passed through this coil, a driving force would not be generated. The driving capability of the respective coils will periodically change as the position of the coils changes. At first, the change of the driving capability will be explained with respect to a one-dimensional direction, as represented by arrows 57 or arrows 58.

Figure 6:
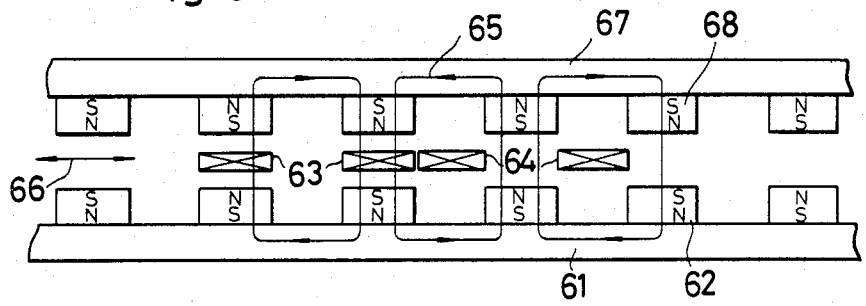
FIG. 6 is a side view showing the same positional relationship.
Figure 7:
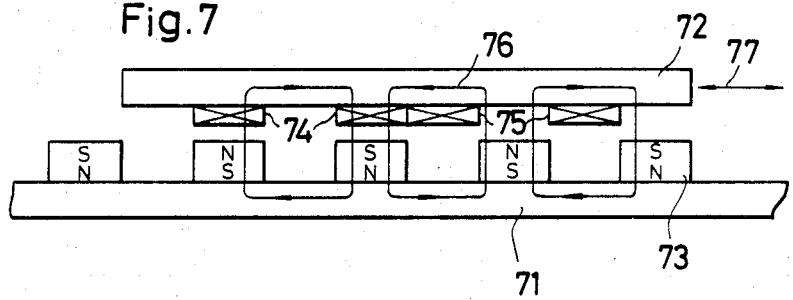
FIG. 7 shows another preferred embodiment of the present invention in which a side view of a two-dimensional current-motion converter having a different construction of magnetic paths from those shown in FIG. 6 is illustrated.

FIGS. 6 and 7 are examples of a cross section taken along arrows 57 or arrows 58. The difference between FIGS. 6 and 7 exists in the method of forming a return path of magnetic flux. In FIG. 6, reference numerals 61 and 62 designate a stator forming a magnetic field, and numerals 67 and 68 designate another stator serving as a return path of the magnetic flux, and the magnetic flux is efficiently closed between a set of adjacent permanent magnets as shown by an arrow 65. Reference numerals 63 and 64 designate coils which have a movable plane along the direction of an arrow 66. On the other hand, in FIG. 7, reference numerals 71 and 73 designate a stator forming a magnetic field, and the magnetic flux closes as shown by an arrow 76 passing through a magnetic conductor 72 which moves jointly with coils 74 and 75 of the armature. Reference numeral 77 designates a movable plane of an armature. In either case, the variation of a driving capability of a coil is as shown in FIG. 8. In FIG. 8, an arrow 81 designates a direction of movement of a coil, and an arrow 82 indicates the magnitude and direction of a driving capability. Numerals 85 and 84 designate driving capability curves of the coils 63 and 64 or the coils 74 and 75, which generally depend upon the shape of the magnetic path, and are close to a triangular waveform, a trapezoidal waveform or a sinusoidal waveform having a period equal to that of the magnetic field. The driving capability curves of the two coils have 90° out-of phase relationship, hence even when one of the curves is zero the other curve has a driving capability. Furthermore, since the driving capability curves in FIG. 8 take similar curves independently for both directions indicated by arrows 57 and 58, respectively, the respective axial components of the driving capability at any arbitrary point on the movable plane is the sum of the respective curves.

A vector sum of the respective axial components represents a resultant driving capability at any arbitrary point on the movable plane. This is shown in FIG. 9.

FIG. 9 is an illustration of a force exerted upon a coil at various positions of the coil when one coil is moved within a magnetic field formed by a stator while a fixed D.C. current is being passed through the coil. In this figure, a direction and a length of an arrow represent the direction and magnitude of the force exerted upon the coil at that position. In this figure, reference numerals 91 and 92 designate the period of the magnetic field in the respective directions.

As described previously, since the positional relationship of a group of four coils is such that each coil is placed at a period equal to an odd multiple of ½ of the period of the magnetic field in the respective axial directions, the four coils are moving in FIG. 9, for instance, while maintaining a mutual positional relationship as reprsented by 93, 94, 95 and 96. Accordingly, upon the respective coils are exerted forces having different directions and magnitude, respectively. Hence, by regulating distribution of currents fed to these four coils, a driving force having any direction and any magnitude on the plane of movement can be generated in the coil group.

However, generally this distribution ratio would become a complex function of the position of the coil group that is different depending upon a distribution of a magnetic flux and a shape of coils.

Figure 10:
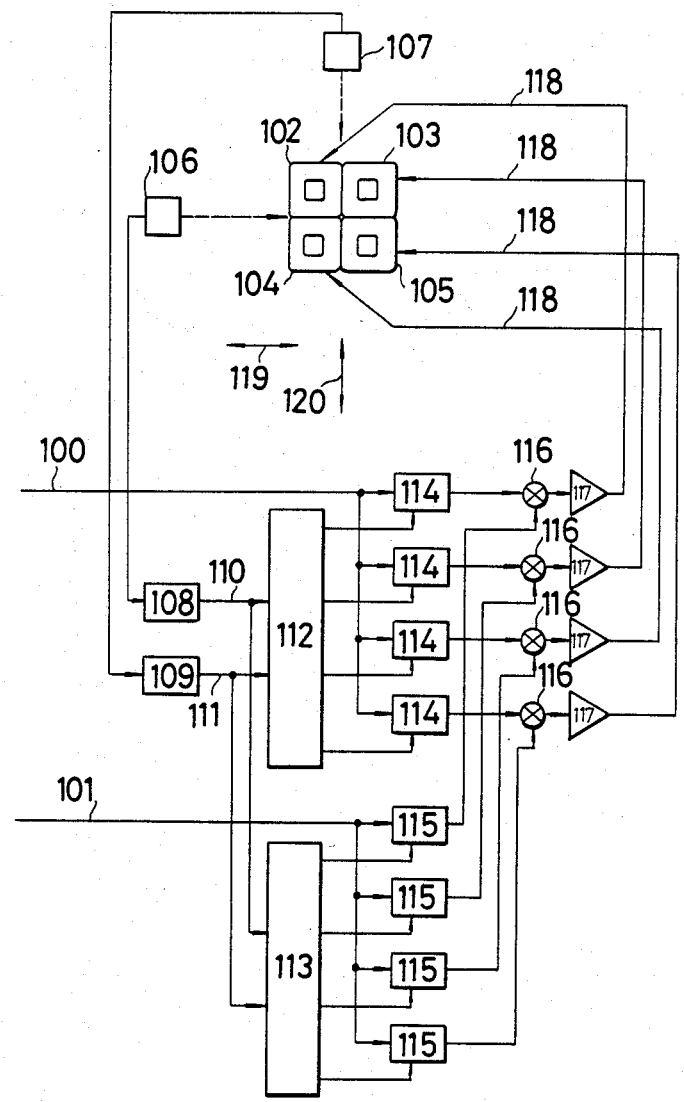
FIG. 10 is a block diagram showing a control system in the two-dimensional precise positioning device according to the present invention.

FIG. 10 is a block diagram of one example of a system for carrying out this current distribution. Reference numerals 100 and 101 designates X-direction and Y-direction drive signal inputs from an external system, and in the illustrated example, they are analog signals having a magnitude and an algebraic sign. Reference numerals 102, 103 104 and 105 designate respective coils, and the positional relationship between this coil group and the magnetic field is measured by position detectors 106 and 107, and they are always maintained in counters 108 and 109, respectively. Accordingly, reference numerals 110 and 111 designate digital signals indicating the positional relationship between the X-direction and Y-direction magnetic fields and the coil. Reference numerals 112 and 113 are current distribution signal generator circuits for feeding four digital values, respectively, which serve as distribution factors for distributing the X-direction and Y-direction drive signals to the four coils depending upon the coil position signals 110 and 111, and in the illustrated example by making use of a read-only memory it is made possible to approximate a distribution ratio represented by a complex functions as fine as possible. Two sets of digital outputs issued from the current distribution signal generator circuits 112 and 113 are applied to corresponding ones of two sets of variable gain amplifier groups, each group consisting of four variable gain amplifiers, and multiplication is effected by analog inputs 100 and 101, respectively. In the illustrated example, the variable gain amplifiers 114 and 115 are multiplier type digital-analog converters including multiplication of algebraic signs.

The drive demand signals distributed for the respective coils by the respective amplifier groups 114 and 115 are added by adders 116 for the respective coils, then respectively passed through voltage-current converters 117 and converted into a drive signal group 118 to drive the corresponding coil.

In this way, in response to the drive demand signals indicated by 100 and 101, the driving force components in the respective directions 119 and 120 can be obtained in proportion to the direction and magnitude. The above-mentioned is the operation principle of the two-dimensional driving device constructed according to the present invention, this is equivalent to the nature of the D.C. motor in the prior art, and accordingly, it is possible to assemble the two-dimensional driving device in the existing D.C. servo system.

While the description of operation of one example of a two-dimensional precise positioning device according to the present invention has been provided above, it is a matter of course that the shape of the loading table, the shapes of the permanent magnet and the coil and their arrangement could be modified without departing from the spirit of the present invention.

What is claimed is:

1. A two-dimensional current-motion converter comprising:

a magnetic field group formed from a plurality of magnetic fields disposed on a plane in a two-dimensional array, the centers of the magnetic fields of the array being separated by an equal period, the magnetic fields of the array being disposed perpendicular to the plane andadjacent magnetic fields being directed in alternate directions; and a first coil group comprising at least first, second, third and fourth coils having a fixed dimensional relationship:

(i) each coil of said first coil group being provided with an outer dimension approximately equal to 3/2 of the period of the array of magnetic fields;

(ii) each coil of said first coil group being provided with a winding width approximately equal to ½ of the period of the array of magnetic fields;

(iii) said second coil of said first coil group being displaced along the plane from said first coil by an odd number multiple of approximately ½ of the period of the array of magnetic fields;

(iv) said third coil of said first coil group being displaced aong the plane in a direction orthogonal to the direction of displacement of said second coil by an odd number multiple of approximately ½ of the period of the array of magnetic fields; and (v) said fourth coil of said first coil group being displaced along the plane from both said second and said third coils by an odd number multiple of approximately ½ the period of the array of magnetic fields;

one of said magnetic field groups and said first coil group being freely movable along the plane.

2. The two-dimensional current-motion converter of claim 1 further comprising a second coil group disposed along the plane and having a fixed dimensional relationship with said first coil group, said second coil group comprising at least four coils having the same dimensional relationship along the plane as said first, second, third and fourth coils of said first coil group.

3. The two-dimensional current-motion converter of claim 2 further comprising a group of position detectors for detecting the position of one of said magnetic field groups or said coil groups, a group of amplifiers for receiving the output of said detectors, said amplifier group having variable amplification factors, and a current distribution signal generator circuit and a voltage-current converter group for receiving the output of said amplifier group and directing drive signals to said coils for displacing one of said magnetic field group and said coil groups.

4. The two-dimensional current-motion converter of claim 3 further comprising a feedback loop for establishing the position of one of said magnetic field group and said coil groups in response to the output of said detector group.

5. The two-dimensional current-motion coverter of claim 4 further comprising an armature, said first and second coil groups being coupled to said armature, a rotation detector for determining the rotation of said armature and a means for controlling the rotation of said armature.

6. The two-dimensional current-motion converter of claim 4 wherein said amplifier group further comprises a multiplier-type digital to analog converter which provides for the multiplication of algebraic signs.

7. The two-dimensional current-motion converter of claim 5 wherein said armature further comprises a plane type static pressure pneumatic bearing to provide for the free movement of said armature along the plane.

8. The two-dimensional current-motion converter of claim 3 wherein said group of detectors further comprises a laser ranging device.

9. The two-dimensional current-motion converter of claim 5 wherein said rotation detector further comprises a laser ranging device.

10. A precision positioning device particularly adapted for a semiconductor manufacturing operation comprising:
  a loading table;
  an armature, said armature being disposed on said loading table;
  a magnetic field group formed from a plurality of magnetic fields disposed on a plane in a two-dimensional array, the centers of the magnetic fields of the array being separated by an equal period, the magnetic fields of the array being disposed perpendicular to the plane and adjacent magnetic fields being directed in alternate directions; and
  a first coil group comprising at least first, second, third and fourth coils having a fixed dimensional relationship:
    (i) each coil of said first coil group being provided with an outer dimension approximately equal to 3/2 of the period of the array of magnetic fields;
    (ii) each coil of said first coil group being provided with a winding width approximately equal to ½ of the period of the array of magnetic fields;
    (iii) said second coil of said first coil group being displaced along the plane from said first coil by an odd number multiple of approximately ½ of the period of the array of magnetic fields;
    (iv) said third coil of said first coil group being displaced along the plane in a direction orthogonal to the direction of displacement of said second coil by an odd number multiple of approximately ½ of the period of the array of magnetic fields; and
    (v) said fourth coil of said first coil group being displaced along the plane from both said second and said third coils by an odd number multiple of approximately ½ the period of the array of magnetic fields;
  one of said magnetic field groups and said first coil group being disposed on said armature and freely movable along the plane.

11. The precision positioning device of claim 10 further comprising a second coil group disposed along the plane and having a fixed dimensional relationship with said first coil group, said second coil group comprising at least four coils having the same dimensional relationship along the plane as said first, second, third and fourth coils of said first coil group.

12. The precision positioning device of claim 11 further comprising a group of position detectors for detecting the position of one of said magnetic field group or said coil groups, a group of amplifiers for receiving the output of said detectors, said amplifier group having variable amplification factors, and a current distribution signal generator circuit and a voltage-current converter group for receiving the output of said amplifier group and directing drive signals to said coils for displacing one of said magnetic field group and said coil groups.

13. The precision positioning device of claim 12 further comprising a feedback loop for establishing the position of one of said magnetic field group and said coil groups in response to the output of said detection group.

14. The precision positioning device of claim 13 wherein said first and second coil groups are coupled to said armature and said precision positioning device further comprises a rotation detector for determining the rotation of said armature and a means for controlling the rotation of said armature.

15. The precision positioning device of claim 13 wherein said amplifier group further comprises a multiplier-type digital to analog converter which provides for the multiplication of algebraic signs.

16. The precision positioning device of claim 14 wherein said armature further comprises a plane type static pressure pneumatic bearing to provide for the free movement of said armature along the plane.

17. The precision positioning device of claim 12 wherein said group of detectors further comprise a laser ranging device.

18. The precision positioning device of claim 14 wherein said rotation detector further comprises a laser ranging device.

* * * * *

UNITED STATES PATENT AND TRADEMARK OFFICE
CERTIFICATE OF CORRECTION

PATENT NO. : 4,535,278
DATED : August 13, 1985
INVENTOR(S) : Teruo Asakawa

It is certified that error appears in the above-identified patent and that said Letters Patent is hereby corrected as shown below:

Column 1, line 62, after "are" insert -- provided, the coils --
Column 7, line 37, "reprsented" should be -- represented --.
Column 7, line 50, "designates" should be -- designate --.
Column 8, line 2, "functions" should be -- function --.
Column 8, line 43 "andadjacent" should be -- and adjacent --.
Column 8, line 59, "aong" should be -- along --

Signed and Sealed this

Thirteenth Day of May 1986

[SEAL]

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4 535 278
DATED : August 13, 1985
INVENTOR(S) : Teruo Asakawa

It is certified that error appears in the above-identified patent and that said Letters Patent is hereby corrected as shown below:

Column 1, line 15:
"displacable" should be --displaceable--.
Column 1, line 17:
Before "step" insert --rotary--.
Column 2, line 68:
After "converter" insert --constructed--.
Column 3, line 11:
"Y-direcion" should be --Y-direction--.
Column 5, line 5:
After "Thus," insert --according--.
Column 5, line 22:
Delete "though".
Column 6, line 22:
After "placed" insert --so that--.
Column 6, line 36:
"off set" should be --offset--.
Column 7, line 11:
"of phase" should be --of-phase--.

Signed and Sealed this

Nineteenth Day of August 1986

[SEAL]

Attest:

Attesting Officer

DONALD J. QUIGG

Commissioner of Patents and Trademarks